(12) United States Patent
Dickinson et al.

(10) Patent No.: US 8,767,400 B2
(45) Date of Patent: Jul. 1, 2014

(54) COOLING MODULE WITH PARALLEL BLOWERS

(75) Inventors: Roger Dickinson, Torrington, CT (US); John O'Connor, New Hartford, CT (US)

(73) Assignee: The Bergquist Torrington Company, Torrington, CT (US)

( * ) Notice: Subject to any disclaimer, the term of this patent is extended or adjusted under 35 U.S.C. 154(b) by 231 days.

(21) Appl. No.: 13/534,722

(22) Filed: Jun. 27, 2012

(65) Prior Publication Data

US 2012/0327599 A1    Dec. 27, 2012

Related U.S. Application Data

(60) Provisional application No. 61/501,535, filed on Jun. 27, 2011.

(51) Int. Cl.
*H05K 7/20* (2006.01)
*F04D 25/00* (2006.01)

(52) U.S. Cl.
USPC ... 361/695; 361/679.5; 361/694; 165/104.33; 165/121; 165/122; 454/184; 415/60; 415/182.1; 415/116; 415/231

(58) Field of Classification Search
USPC ............ 361/679.46, 679.48, 679.49, 679.5, 361/690–696, 724–728; 165/104.33, 165/121–126, 80.2, 185; 415/53.1, 60, 415/213.1, 182.1, 206, 231; 454/184
See application file for complete search history.

(56) References Cited

U.S. PATENT DOCUMENTS

| | | | |
|---|---|---|---|
| 2,976,352 A | | 2/1961 | Atalla |
| 4,233,644 A | | 11/1980 | Hwang et al. |
| 4,648,007 A | | 3/1987 | Garner |
| 4,774,631 A | | 9/1988 | Okuyama et al. |
| 4,797,783 A | | 1/1989 | Kohmoto |
| 5,168,424 A | | 12/1992 | Bolton et al. |
| 5,398,159 A | * | 3/1995 | Andersson et al. ........... 361/695 |
| 5,412,534 A | * | 5/1995 | Cutts et al. .................... 361/695 |
| 5,949,646 A | | 9/1999 | Lee et al. |
| 6,011,689 A | | 1/2000 | Wrycraft |
| 6,256,197 B1 | | 7/2001 | Galis |
| 6,276,900 B1 | | 8/2001 | Lyszkowski |
| 6,388,880 B1 | | 5/2002 | El-Ghobashy |
| 6,407,918 B1 | | 6/2002 | Edmunds et al. |
| 6,459,580 B1 | | 10/2002 | Della Fiora |
| 6,496,368 B2 | | 12/2002 | Jui-Yuan |
| 6,504,715 B2 | * | 1/2003 | Ota et al. ....................... 361/695 |
| 6,573,671 B2 | | 6/2003 | Montero et al. |
| 6,728,099 B1 | | 4/2004 | Tsang et al. |
| 6,739,846 B2 | | 5/2004 | Stoddard et al. |
| 6,819,560 B2 | * | 11/2004 | Konshak et al. ........... 361/679.5 |
| 6,826,456 B1 | | 11/2004 | Irving et al. |

(Continued)

FOREIGN PATENT DOCUMENTS

GB         2387716 A         10/2006

*Primary Examiner* — Michail V Datskovskiy
(74) *Attorney, Agent, or Firm* — Haugen Law Firm PLLP (57) ABSTRACT

A cooling system for an electronics chassis includes a plurality of centrifugal blowers arranged to motivate cooling air through the electronics chassis. The centrifugal blowers are arranged in one or more sets, each having blowers oriented with respective inlets in mutual facing relationship. The orientation, positioning, and alignment of the centrifugal blowers facilitates a compact arrangement of the plurality of blowers that achieves increased aerodynamic efficiencies to reduce noise output and energy consumption.

13 Claims, 7 Drawing Sheets

(56) References Cited

U.S. PATENT DOCUMENTS

| | | | |
|---|---|---|---|
| 6,896,611 B2 | 5/2005 | Giraldo | |
| 7,018,171 B2 | 3/2006 | Wang | |
| 7,046,470 B2 * | 5/2006 | Yamanashi et al. | 360/69 |
| 7,086,459 B2 | 8/2006 | Beitelmal | |
| 7,113,401 B2 * | 9/2006 | Becker et al. | 361/694 |
| 7,126,818 B2 * | 10/2006 | Lu et al. | 361/695 |
| 7,270,419 B2 | 9/2007 | Russell et al. | |
| 7,342,789 B2 * | 3/2008 | Hall et al. | 361/701 |
| 7,405,932 B2 * | 7/2008 | Vinson et al. | 361/695 |
| 7,431,073 B2 | 10/2008 | Radke et al. | |
| 7,450,380 B2 | 11/2008 | Curtis et al. | |
| RE40,630 E | 1/2009 | McEwan | |
| 7,630,198 B2 * | 12/2009 | Doll | 361/679.49 |
| 7,675,747 B1 | 3/2010 | Ong et al. | |
| 7,714,524 B2 | 5/2010 | Frankel et al. | |
| 7,922,442 B2 | 4/2011 | Hopkins | |
| 7,965,504 B2 * | 6/2011 | Hamlin | 361/695 |
| 8,004,839 B2 | 8/2011 | Sato et al. | |
| 8,047,904 B2 | 11/2011 | Yates et al. | |
| 8,102,173 B2 | 1/2012 | Merrow | |
| 8,122,884 B2 | 2/2012 | Daly et al. | |
| 8,125,779 B2 * | 2/2012 | Aybay et al. | 361/695 |
| 8,292,705 B2 * | 10/2012 | Matsuzawa et al. | 454/184 |
| 2003/0124970 A1 * | 7/2003 | Webster et al. | 454/184 |
| 2008/0247135 A1 | 10/2008 | Inoue et al. | |
| 2010/0091458 A1 * | 4/2010 | Mosier et al. | 361/695 |
| 2011/0045759 A1 | 2/2011 | Rasmussen et al. | |
| 2011/0308777 A1 * | 12/2011 | O'Connor et al. | 165/121 |
| 2012/0057962 A1 | 3/2012 | Hopkins | |

\* cited by examiner

FIG. 6

COOLING MODULE WITH PARALLEL BLOWERS

CROSS-REFERENCE TO RELATED APPLICATIONS

This application claims priority to U.S. provisional Patent Application Ser. No. 61/501,535, filed on Jun. 27, 2011 and entitled "Cooling Module with Parallel Blowers", the content of which being incorporated herein in its entirety.

FIELD OF THE INVENTION

The present invention relates to cooling systems generally, and more particularly to cooling fan arrays specifically arranged for enhanced performance in motivating cooling fluid through an electronics chassis.

BACKGROUND OF THE INVENTION

Designers of electronic equipment have become increasingly challenged to provide high-power devices in relatively small packages. These devices require compact and highly efficient cooling systems. A typical cooling system involves moving air across one or more printed circuit boards. The flow path layout, type of air moving device, and how well it is integrated into the system are all key elements in achieving the desired performance in a small package size with limited noise.

One such electronic device is a telecommunications router which typically includes a series of electronics communications "cards" arrayed with cooling fans in a chassis. The desire to make routers more powerful, yet compact in size, leaves little space for cooling system components necessary to address ever-increasing heat loads. Conventional system designs often employ fans that are not well matched to the system pressures, or do not move air efficiently within the space constraints, and result in unacceptable noise and relatively large power consumption.

Figure 1:
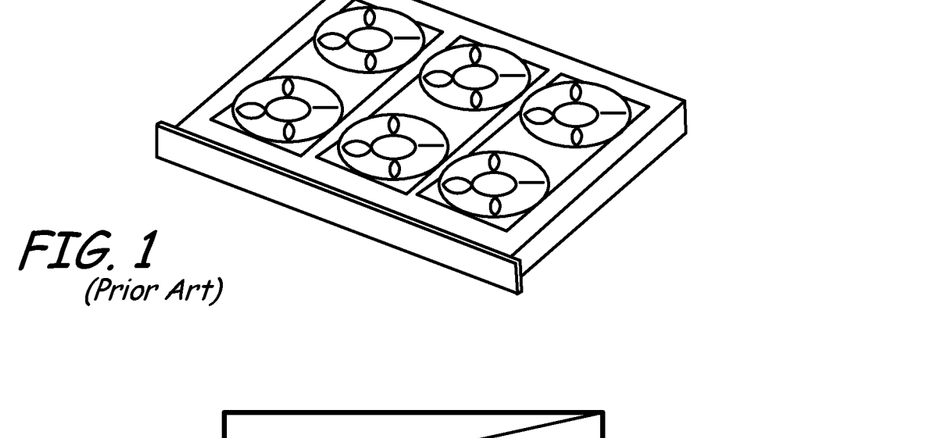
FIG. 1 is an illustration of an axial fan tray arrangement of the prior art.
Figure 2:
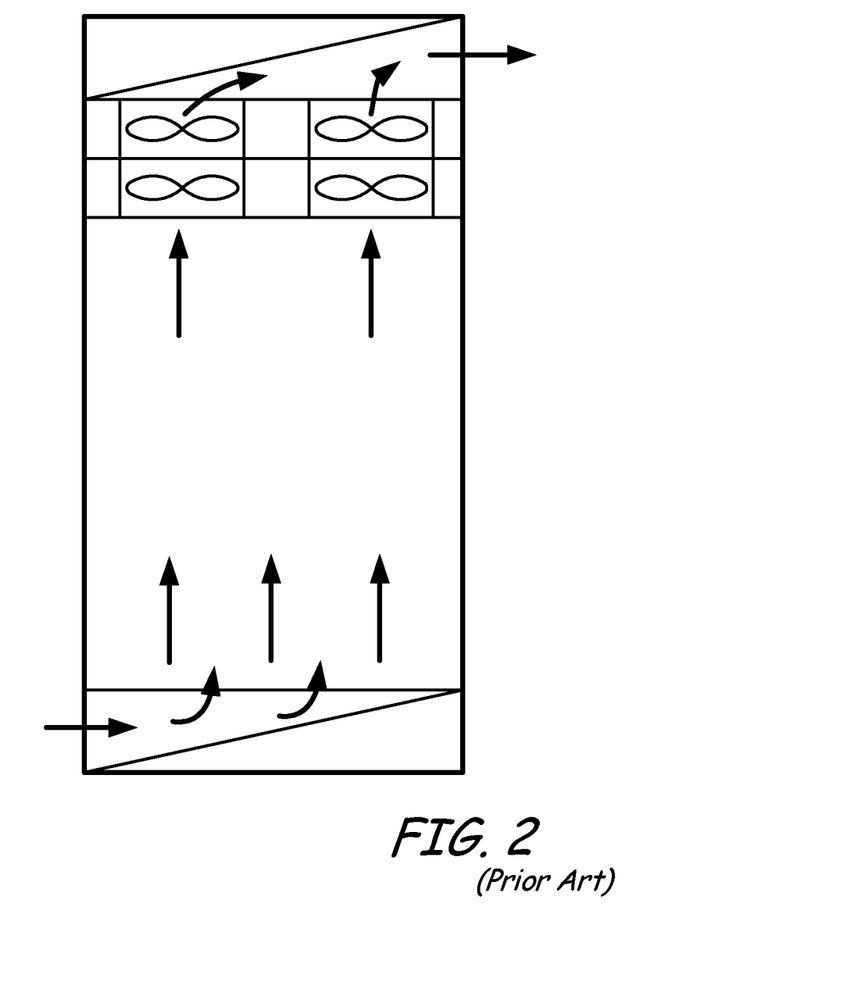
FIG. 2 is a schematic diagram of an axial-type fan tray arrangement in series of the prior art.

Design efforts to date typically use multiple axial fans arranged in a "tray", as illustrated in FIG. 1. The fans either push cooling air through a chassis or pull warm air out from the chassis. Higher fan speeds have been used to address increased flow requirements, but as system pressures increase, designers have responded by adding additional trays of axial fans arranged in series. An example of such series of axial fan trays is illustrated in FIG. 2. In theory, each axial fan tray handles half of the system pressure. The conventional arrangement illustrated in FIG. 2 sets forth an orientation with both fan trays downstream from the electronics being cooled in the electronics chassis, thereby pulling cooling air through the system. In other conventional arrangements, fan trays may be disposed upstream of the electronics being cooled, or fan trays being disposed both upstream and downstream of the electronics in a push-and-pull-through system. Relatively high aerodynamic efficiencies may be achieved with this type of air mover, but unfortunately require high rotational speeds that typically result in unacceptable acoustic levels.

Centrifugal blowers are better suited for the higher pressures encountered in high cooling load applications. However, centrifugal blowers have not typically been considered for electronics chassis cooling, particularly in compact arrangements, due to their relatively larger physical size. As a result, centrifugal blowers have not commonly been considered for fit within cooling system packaging space. For example, a single inlet centrifugal blower sized to match the performance of two axial fans in series can require twice the volumetric space, be less efficient, and result in a less uniform flow field.

It is therefore an object of the present invention to provide a cooling system that simultaneously increases performance and reduces noise of conventional air movers.

It is a further object of the present invention to provide a cooling arrangement that is particularly well suited for cooling densely populated electronic components, such as telecommunication edge routers.

SUMMARY OF THE INVENTION

By means of the present invention, enhanced cooling to electronics chassis may be achieved with greater efficiency and reduced acoustic levels. The present cooling system provides cooling fluid, such as cooling air, in a generally uniform flow field across electronic components for cooling thereof. The electronic components may be disposed in a chassis, such as a telecommunication edge router, server, or a power supply unit.

In one embodiment, a cooling fan array of the present invention is arranged for motivating cooling fluid through an interior chamber of an electronics chassis generally along a flow direction. The cooling fan array includes a frame having a cooling fluid entrance and a cooling fluid exit in fluid communication with the interior chamber, with at least one of the frame entrance and exit directing air flow therethrough along a direction parallel with the flow direction. The frame further includes a plurality of modules individually removable from and replaceable in the frame without operational interruption to others of the modules. Each of the modules includes a centrifugal blower with an impeller driven by a motor and defining an axis of rotation, wherein the blower includes an inlet arranged to intake the cooling fluid along a respective intake direction transverse to the flow direction. The blowers are arranged in the frame in one or more sets, with each set including at least two blowers oriented with respective inlets in facing relationship with one another and with respective axes of rotation being axially aligned with one another, the facing inlets being axially spaced apart by a spacing dimension that is less than 75% of a diameter dimension of the impeller within the set, such that the blowers operate in parallel to motivate the cooling fluid through the cooling fluid inlet.

In another embodiment, an electronics chassis of the present invention includes an interior chamber through which cooling fluid is motivated generally along a flow direction to cool electronic components. The chassis further includes a frame having an entrance through which the cooling fluid is drawn from the interior chamber, and an exit. A plurality of modules may be disposed in the frame, and are individually removable from and replaceable in the frame without operational interruption to others of the modules. Each of the modules includes a centrifugal blower with an impeller driven by a motor and defining an axis of rotation. The centrifugal blower includes dual opposed inlets arranged to intake the cooling fluid along respective intake directions transverse to the flow direction. The blowers are arranged in the frame in one or more sets, with each set including at least two blowers oriented with respective inlets in facing relationship with one another and with respective axes of rotation being axially aligned with one another, the facing inlets being axially spaced apart by a spacing dimension that is less than 75% of a diameter dimension of the impeller within the set, such that the blowers operate in parallel to motivate the cooling fluid through the frame inlet.

In a further embodiment, an electronics chassis includes an interior chamber through which cooling fluid is motivated generally along a flow direction to cool electronic components disposed in the interior chamber. The chassis further includes a frame having an entrance through which the cooling fluid is drawn from the interior chamber, and an exit. A plurality of modules in the frame are individually removable from and replaceable in the frame without operational interruption to others of the modules. Each of the modules includes one or more sets of two centrifugal blowers having forward-curved impellers driven in opposite circumaxial directions with respect to one another about respective impeller axes of rotation. The centrifugal blowers each have an inlet and an outlet, wherein the respective centrifugal blower inlets of the set are arranged to intake the cooling fluid along respective substantially opposite intake directions that are both transverse to the flow direction. The blowers of the set are arranged in the frame to operate in parallel to motivate the cooling fluid through the frame entrance.

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures which are intended to be representative of various embodiments of the invention. Other embodiments and aspects of the invention are recognized as being within the grasp of those having ordinary skill in the art.

Figure 3:
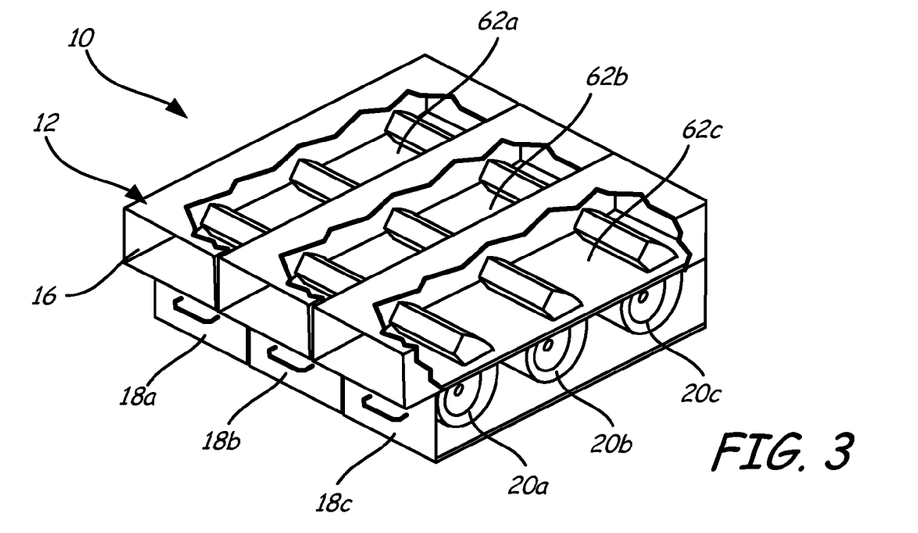
FIG. 3 is an illustration of a cooling fan array of the present invention.
Figure 4A:
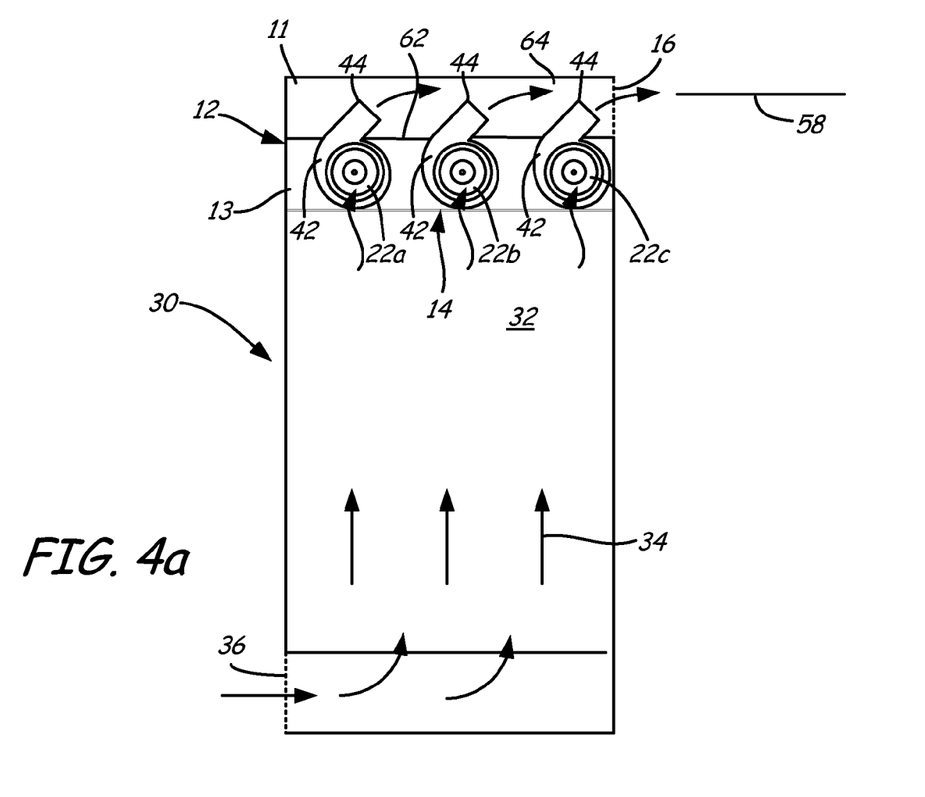
FIG. 4a is a schematic illustration of an electronics chassis of the present invention incorporating the cooling fan array of FIG. 3.

With reference now to the drawings, and first to FIGS. 3 and 4a, a cooling fan array 10 includes a frame 12 having a cooling fluid entrance 14 and a cooling fluid exit 16. Frame 12 includes a plurality of modules 18a-18c that are individually removable from and replaceable in frame 12 without operational interruption to others of modules 18a-18c. Such a characteristic is known in the art as being "hot swappable", in that each of modules 18a-18c may be removed from frame 12 for repair or replacement without interrupting or substantially affecting the operation of the remaining modules 18a-18c of housing 12. In this manner, maintenance may be performed upon a respective module 18a-18c without requiring shut down of the entire cooling fan array 10, which would require shut down of the electronics chassis being cooled by cooling fan array 10. In some cases, removal of one or more of modules 18a-18c from housing 12 requires increased blower speed in the remaining modules to accommodate and maintain a desired cooling fluid flow rate through the electronics chassis. Control systems for electronically controlling the blowers of hot-swappable modules for air-cooling systems are well understood in the art.

Each of the modules 18a-18c in frame 12 may include one or more double-width double-inlet forward curved (DWDI-FC) centrifugal blowers 20. In the example arrangement of FIG. 3, frame 12 includes three modules 18a-18c, each of which includes three DWDI-FC centrifugal blowers 20. It is to be understood, however, that frame 12 of the present invention may include any number of a plurality of modules 18a-18c, with each module having, for example, one or more DWDI-FC centrifugal blowers 20. Moreover, modules 18a-18c of frame 12 may include different numbers of DWDI-FC blowers 20. In typical embodiments, each DWDI-FC centrifugal blower 20a-20c is driven by a motor, such as a DC brushless motor that is independently controllable by a control system to adjust and maintain desired cooling air flow characteristics through frame 12 and the associate electronics chassis.

FIG. 4a illustrates frame 12 secured to an electronics chassis 30 in an embodiment wherein cooling fan array 10 is arranged to pull air flow through a series of electronics communication cards arrayed in an interior chamber 32 of electronics chassis 30 generally along a flow direction 34 to cool the electronic components disposed at interior chamber 32 of electronics chassis 30. Cooling fluid flow (represented by arrows) is drawn through electronics chassis 30 from an inlet 36, into cooling fluid entrance 14 of frame 12, and finally out from cooling fan array 10 at cooling fluid exit 16. Centrifugal blowers 20 in parallel motivate the cooling fluid flow along flow direction 34, and motivate the cooling fluid flow "in parallel" by each blower individually acting upon cooling fluid flow through interior chamber 32 of electronics chassis 30. In addition, blowers 20a-20c of each of modules 18a-18c motivate the cooling fluid flow "in parallel" by receiving cooling fluids to their respective inlets that is sourced directly from cooling fluid passing through interior chamber 32, and not as exhaust from an "upstream" blower within its associated frame 12. It is contemplated that a plurality of frames 12 may be employed in a cooling fan array 10, wherein the respective frames 12 may operate in series to motivate cooling fluid through electronics chassis 30. In such case, blowers 20 of a "downstream" housing 12 would in fact receive the exhaust from an "upstream" blower. However, the blowers 20 within a respective frame 12 operate in parallel to receive substantially only "fresh" air entering frame 12 through cooling fluid entrance 14.

Blowers 20, such as blowers 20aa-20ac each include dual opposed inlets 22, 24 arranged to intake the cooling fluid along respective intake directions 26, 28 which are transverse to flow direction 34. Such an arrangement is best viewed in FIG. 4b, which is identical to the system illustrated in FIG. 4a with the exception of the cooling fluid outlet directionality. Cooling fluid exit 16 of the embodiment illustrated in FIG. 4a is transverse to flow direction 34, while cooling fluid exit 16 of the embodiment illustrated in FIG. 4b permits outflow parallel to flow direction 34. It is contemplated that frame 12 may be provided, in some embodiments, with any suitable cooling fluid outlet arrangement and orientation, including for either or both of cooling fluid outlet directions transverse or parallel to flow direction 34.

Figure 4B:
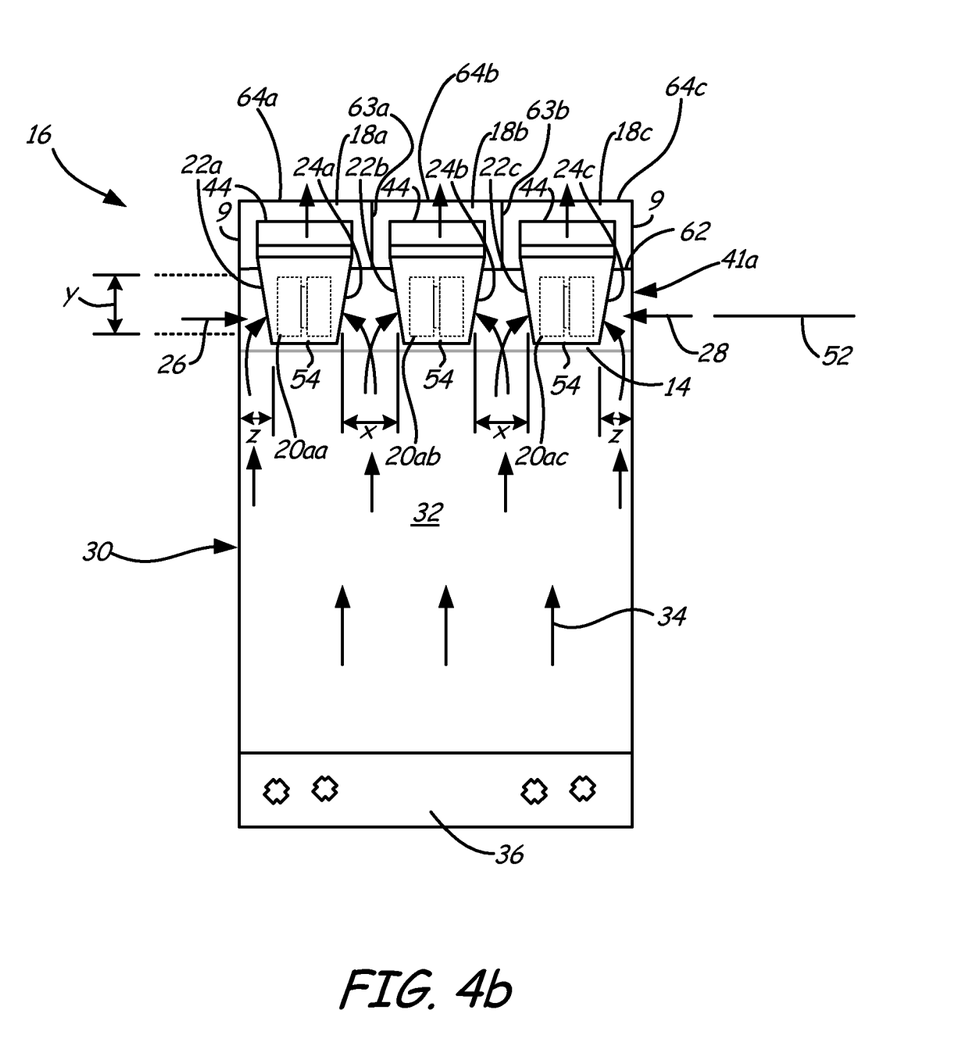
FIG. 4b is a schematic illustration of an electronics chassis of the present invention incorporating a cooling fan array of the present invention.

In some embodiments, each of blowers 20 include a single-scroll blower housing 42 which defines the dual-opposed inlets 22, 24 and a blower outlet 44. Centrifugal blowers 20 may further include a forward-curved impeller having a diameter dimension "y", and defining an axis of rotation 52 which extends through inlets 22, 24 substantially transverse to flow direction 34. Blowers 20 each include a motor 54 for rotation of the respective impellers about their rotation axis 52. In the illustrated embodiments, respective blowers 20 in modules 18 define sets 41 of axially adjacent blowers. For example, blowers 20aa-20ac, as shown in FIG. 4b, represent a set 41a of blowers having respective impellers that axially aligned about axis of rotation 52. In this example, blower 20aa is a part of module 18a, blower 20ab is a part of module 18b, and blower 20ac is a part of module 18c. Thus, set 41a of blowers 20aa-20ac may include one or more blowers from a plurality of distinct modules 18a-18c. In other embodiments, however, blower sets 41a-41c may be confined to a plurality of blowers within a single respective module 18a-18c. Blower sets 41a-41c preferably include a plurality of centrifugal blowers 20 that are arranged in frame 12 with their respective impeller axes of rotation axially aligned with one another, with axially adjacent inlets of axially adjacent blowers 20 being in mutually facing relationship. In the illustrated embodiment, blowers 20a-20c of blower set 41a are DWDI-FC centrifugal blowers having respective impeller axes of rotation aligned along axis 52. Axially adjacent blower inlets 24a, 22b and 24b, 22c are in facing relationship with one another drawing inlet air in opposite directions and transverse to flow direction 34, as depicted by the air flow arrows in FIG. 4b. This arrangement has been discovered by the applicant to improve air flow efficiencies in motivating air flow through electronics chassis 30.

In some embodiments, adjacent blower inlets 24a, 22b and 24b, 22c are not only axially aligned, but also spaced apart by a specific spacing dimension "x". In some embodiments, such spacing dimension "x" may be less than about 0.75 (75%) of diameter dimension "y" of the impeller of blowers 20, and more preferably between 0.5 and 0.75 (50%-75%) of diameter dimension "y" of the impeller of blowers 20. In the event that the diameter dimension "y" of the axially adjacent pair of blowers is not equal, the spacing dimension "x" may be determined as 0.5-0.75 (50-75%) of the diameter dimension "y" of the larger impeller. Similarly, a spacing dimension "z" between a blower inlet and an axially adjacent wall, such as between blower inlet 22a and a side wall 9 of frame 12, may be between about 0.2-0.5 (20-50%) of diameter dimension "y" of the respective blower impeller, and more preferably between 0.23-0.36 (23-36%) of the respective impeller diameter dimension "y".

The arrangements illustrated in FIGS. 4a and 4b have been found to provide surprisingly enhanced aerodynamic efficiency for each blower 20, such that total power input to motivate a desired cooling fluid flow may be reduced. In addition, the surprising efficiency of the proposed arrangement reduces sound emissions, which is also a beneficial operating characteristic of the cooling fan arrays of the present invention. Such enhancements in efficiency and sound reductions may be accomplished in a housing volume that is not substantially larger than the volume assumed by conventional fan trays. Therefore, it is believed that the arrangements of the present invention substantially improve cooling fan arrays.

Figure 6:
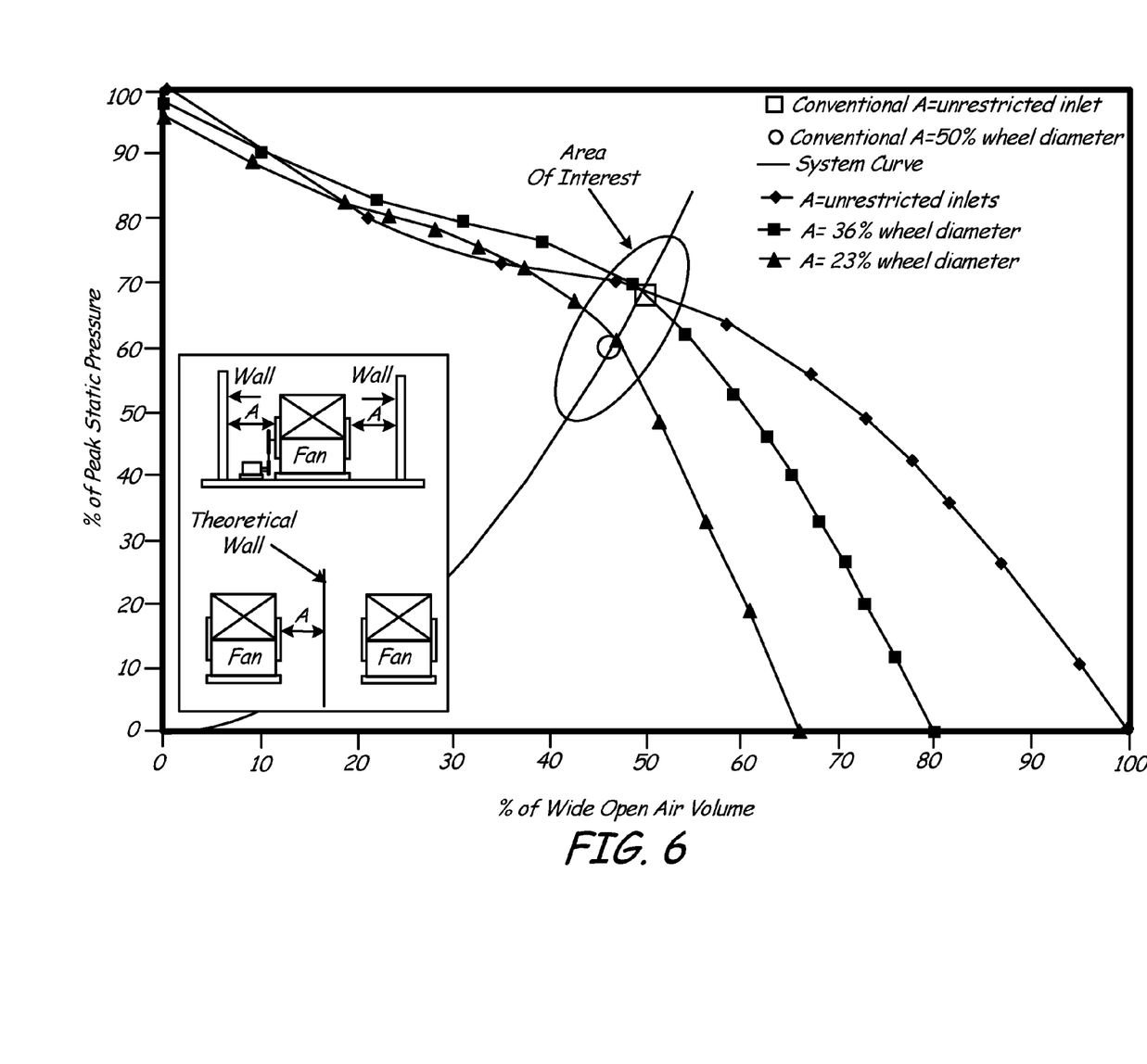
FIG. 6 is a chart depicting performance characteristics of a cooling fan array of the present invention.

Applicants are particularly surprised to discover that the small axial spacing between adjacent blower inlets, and between a blower inlet and an axially adjacent wall, does not diminish aerodynamic performance in the operation of the centrifugal blowers. FIG. 6 is a graphical depiction of aerodynamic performance curves at various relative dimensions for spacing "A", wherein spacing "A" may be between a blower inlet and an axially adjacent wall, equivalent to spacing dimension "z" in FIG. 4b, or one-half of the spacing dimension between axially adjacent inlets, equivalent to spacing dimension "x"/2. As depicted in FIG. 6, the present arrangement of axially aligned centrifugal blowers with a spacing "A" of 36% of the impeller diameter exhibits aerodynamic performance that is equivalent to centrifugal blowers with "unrestricted" inlets, which are defined as having a spacing "A" that is sufficiently large to avoid disturbance to inlet air flow. In effect, therefore, the "unrestricted inlet" data in FIG. 6 assumes an infinite spacing "A".

The data graphically depicted in FIG. 6 reveals a surprising result of the present invention, in that a centrifugal blower arrangement with a spacing "A" of 36% of an impeller diameter dimension "y" of the blower applied to motivating air through an interior chamber 32 of electronics chassis 30, as depicted by the "system curve" of FIG. 6, exhibits substantially equivalent aerodynamic performance to centrifugal blowers with unrestricted inlets. Such a discovery is counter to conventional understanding of centrifugal blower aerodynamic performance, wherein restricted inlet spacing "A" consistently reduces aerodynamic performance of the blower. Applicants have surprisingly discovered that, even with centrifugal blower inlets "restricted" with a spacing "A" of 36% of the impeller diameter, can achieve aerodynamic performance equivalent to centrifugal blowers with unrestricted inlets, as measured in a cooling system application. FIG. 6 further reveals that the present arrangement of axially aligned centrifugal blowers with a spacing "A" of 23% of the impeller diameter, as applied in motivating air through chassis 30, is substantially equivalent to conventional centrifugal blower arrangements with a spacing "A" of 50% of the impeller diameter.

Applicants theorize that the discovery of unexpected aerodynamic performance at small spacing dimensions between adjacent centrifugal blowers may be at least in part the result of coinciding vortices just upstream from the respective blower inlets, wherein the coincidence of the vortices is created as a consequence of the small axial spacing dimensions. The coincident vortices may be synergistic in generating a highly efficient aerodynamic flow into the respective blower inlets. Such a finding is contrary to conventional understanding, which predicts aerodynamic performance degradation with the presence of another operating blower within the flow field of the first blower. The results depicted in FIG. 6 clearly indicate otherwise.

The arrangement illustrated in FIG. 4b includes a frame 12 incorporating a separation plate 62 defining an outlet plenum 64 of frame 12 which primarily separates inlets 22, 24 of blowers 20 from respective outlets 44. Outlet plenum 64 is therefore fluidly connected to cooling fluid entrance 14 only through blowers 20, such that cooling fluid is motivated through interior chamber 32 of electronics chassis 30 into cooling fluid entrance 14 and into respective inlets 22, 24 of blowers 20 for exhaust out through blower outlets 44, and ultimately out through cooling fluid exit 16. Thus, outlet plenum 64 is fluidly connected to cooling fluid exit 16.

Separation plate 62 creates separation between a negative pressure side 13 from a positive pressure side 11 of frame 12. Separation plate 62 therefore eliminates the need for separate ducts from each blower 20 in a module 18, and reduces recirculation to negative pressure side 13 in the event of blower failure. The need for back draft dampers is therefore substantially reduced or eliminated. As illustrated in FIG. 3, each module 18a-18c may include a separation plate 62a-62c for separating positive and negative pressure sides 11, 13 of a respective module 18. Outlet plenum 64 may further be divided by divider plates 63a, 63b to define individual module outlet plenums 64a-64c. Divider plates 63a, 63b segment outlet plenum 64 as individual outlet zones from the blowers of each module 18a-18c.

Outlets 44 of blowers 20 may be canted at an angle, such as at 45°, to promote cooling fluid exhaust more directly out through cooling fluid exit 16 along an outlet axis 58 that is substantially transverse to flow direction 34. In other embodiments, such as that illustrated in FIG. 4b, blower outlets 44 may be directed axially in parallel with flow direction 34 to direct exhaust cooling fluid axially out from cooling fluid exit 16.

The systems illustrated in FIGS. 4a and 4b depict a "pull" system employing a plurality of DWDI-FC centrifugal blowers arranged to motivate the cooling fluid flow in parallel, and with parallel cooling fluid discharges. Moreover, the respective inlets 22, 24 of blowers 20 are arranged transverse to flow direction 34. Such arrangement represents a substantial noise reduction in comparison to similar packaging space allocated for conventional axial fan trays.

Figure 5A:
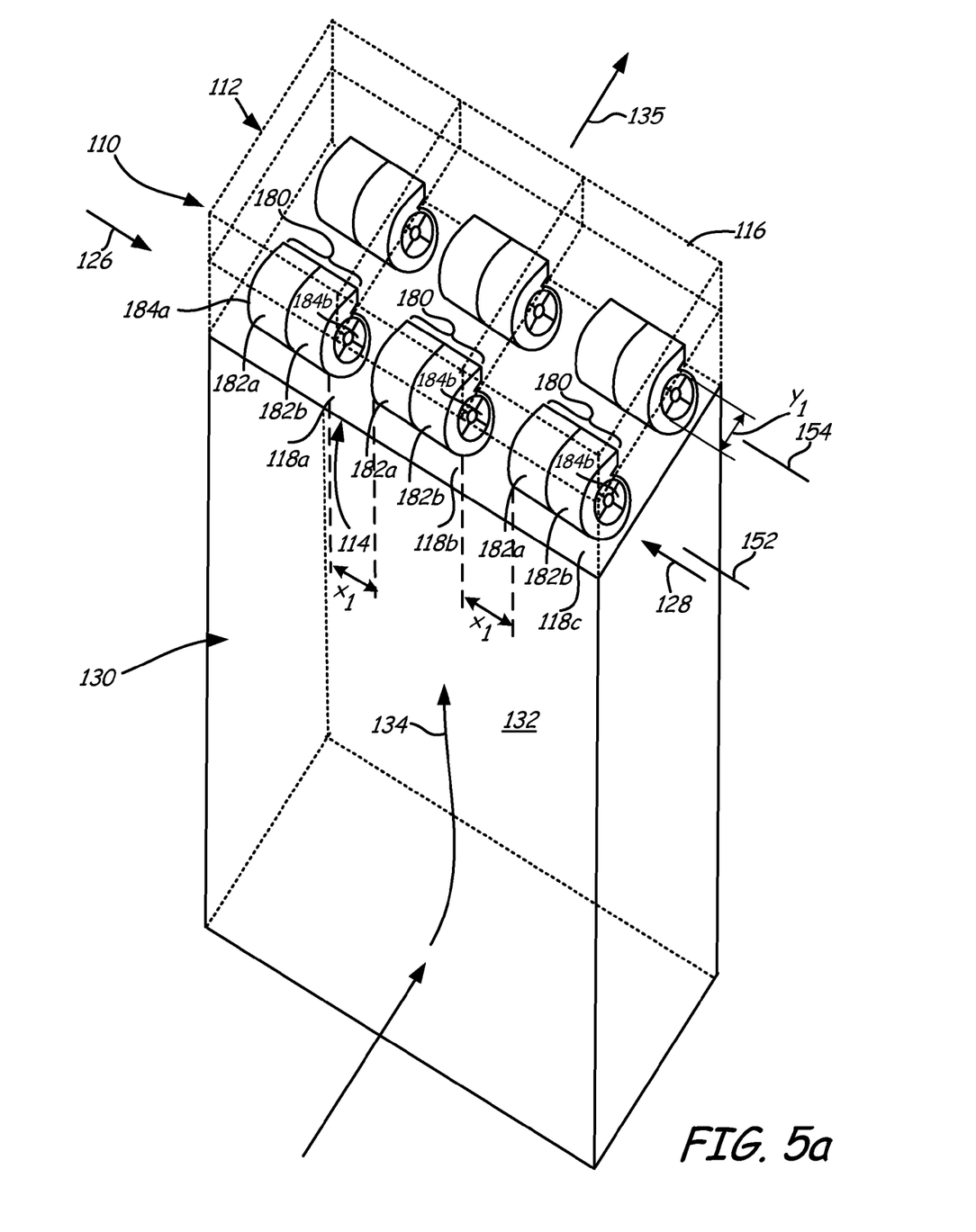
FIG. 5a is a schematic illustration of an electronics chassis of the present invention incorporating a cooling fan array of the present invention.

A further embodiment is illustrated in FIG. 5a, wherein cooling fan array 110 includes a frame 112 having a cooling fluid entrance 114 and a cooling fluid exit 116. Frame 112 includes a plurality of modules 118a-118c that are individually removable from and replaceable in frame 112 without operational interruption to others of modules 118a-118c. In this embodiment, each of the modules 118 in cooling fan array 110 includes one or more sets of "forward-curved" centrifugal blowers 180. In the example arrangement of FIG. 5a, each set of forward curved centrifugal blowers 180 includes two centrifugal blowers 182a, 182b placed back to back, such that inlet 184a of blower 182a is oppositely disposed from inlet 184b of blower 182b. Due to such opposite orientations, the respective impellers of blowers 182a, 182b may be configured to rotate in opposite circumaxial directions with respect to one another about an axis of rotation 152. The opposite circumaxial rotational directions have been found to generate desired cooling fluid flow characteristics through frame 112 and interior chamber 132. Blower sets 180 may include two or more blowers 182a, 182b which may be arranged to coordinate with other blowers of the module 118 and/or array 110 to motivate cooling fluid flow through interior chamber 132 of electronics chassis 130. Blower sets 180 may operate to motivate the cooling fluid flow along flow direction 134, and to motivate the cooling fluid flow "in parallel".

In the illustrated embodiment, each module 118a-118c includes two sets 180 of forward-curved centrifugal blowers 182a, 182b. Frame 112 of the present invention, however, may include any number of a plurality of modules 118a-118c, with each module having one or more sets 180 of blowers 182. In some embodiments, respective sets 180 of blowers 182a, 182b among a plurality of modules 118 may be arranged so that their respective axes of rotation through inlets 184a, 184b are all substantially mutually aligned along a respective axis 152, 154. In typical embodiments, each blower 182 may be driven by a motor, such as a DC brushless motor that is independently controllable by a control system to adjust and maintain desired cooling fluid flow characteristics through frame 112 and the associated electronics chassis 132.

Blowers 182 each include a respective inlet 184 that is arranged to intake the cooling fluid along a respective intake direction 126, 128 which is transverse to flow direction 134.

In the embodiment illustrated in FIG. 5a, cooling fluid exit 116 permits outlet flow from blowers 182 along an outlet direction 135 that is substantially transverse to flow direction 134. It is contemplated, however, that frame 112 may be provided with any suitable cooling fluid exit arrangement and orientation, including for either or both of cooling fluid outlet directions transverse or parallel to flow direction 134.

It is contemplated that the blower sets 180 may be configured to provide desired cooling fluid flow in a manner similar to blowers 20 described hereinabove. Blower sets 180, however, utilize, for example, single-inlet forward-curved centrifugal blowers placed in back to back relationship to together motivate cooling fluid flow through electronics chassis 130. In some embodiments, respective blowers 182a, 182b may be in abutting relationship with one another, or may be spaced apart by a desired spacing dimension. Moreover, mutually facing inlets of axially adjacent blowers may preferably have a spacing dimension "$x_1$" of less than about 0.75 (75%) of a diameter dimension "$y_1$" of the impellers of respective blowers 182a, 182b, and more preferably between 0.5-0.75 (50-75%) of diameter dimension "$y_1$". The respective inlets 184a, 184b of blowers 182a 182b lead to impellers which may preferably be axially aligned along a respective axis of rotation.

Figure 5B:
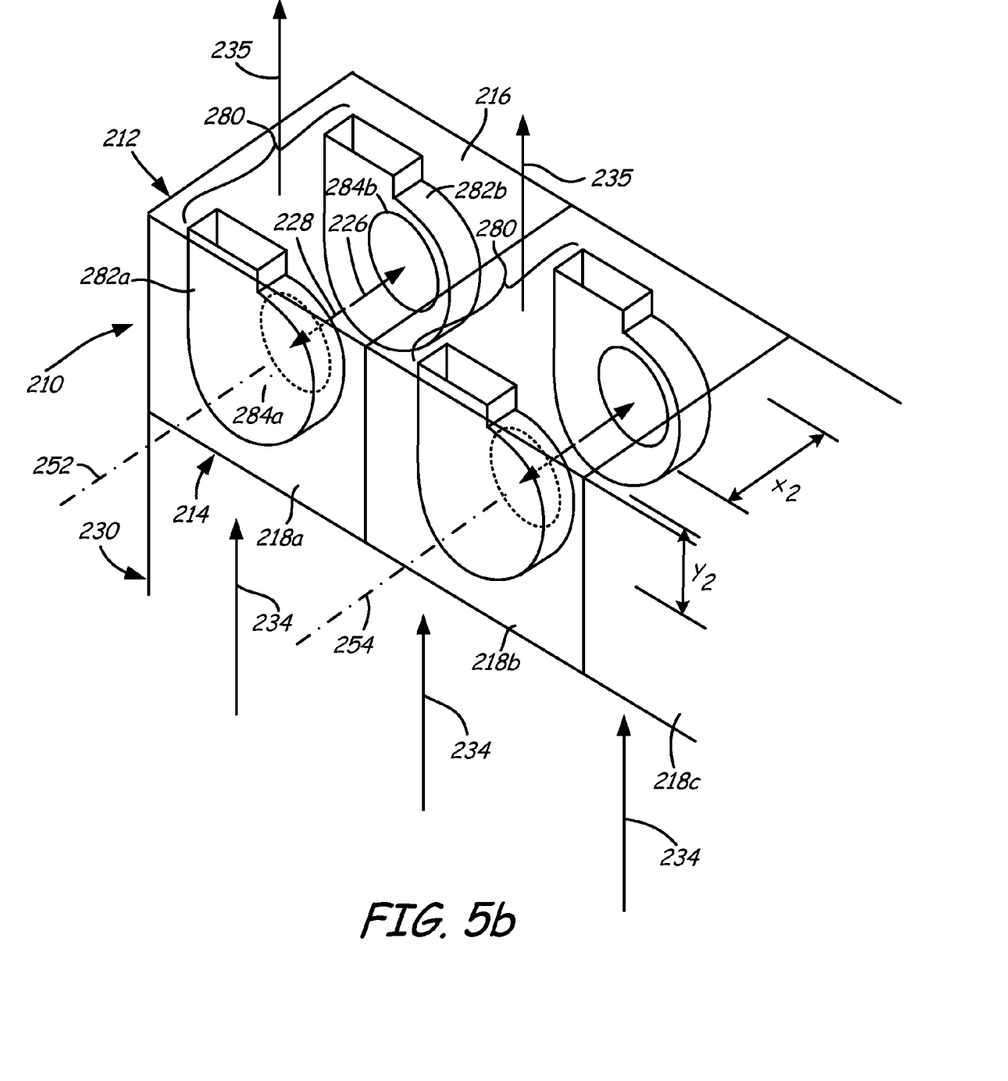
FIG. 5b is a schematic illustration of a cooling fan array of the present invention.

Another embodiment is illustrated in FIG. 5b wherein cooling fan array 210 includes a frame 212 having a cooling fluid entrance 214 and a cooling fluid exit 216. Frame 212 includes a plurality of modules 218a-218c that are individually removable from and replaceable in frame 212 without operational interruption to others of modules 218a-218c. In this embodiment, each of the modules 218 in cooling fan array 210 includes one or more sets of centrifugal blowers 280, which may include forward-curved impellers. In the illustrated embodiment, each set of centrifugal blowers 280 includes two centrifugal blowers 282a, 282b placed in facing relationship to one another, such that inlet 284a of blower 282a is in generally facing relationship with inlet 284b of blower 282b. The respective impellers of blowers 282a, 282b may be configured to rotate in opposite circumaxial directions with respect to one another about an axis of rotation 252. Blower sets 280 may be arranged to coordinate with other blowers of the respective module 218 and/or array 210 to motivate cooling fluid flow through the associated electronics chassis 230. Blower sets 280 may operate to motivate the cooling fluid flow along flow direction 234, and to motivate the cooling fluid flow "in parallel".

In the illustrated embodiment, each module 218 includes one set 280 of centrifugal blowers 282a, 282b. Frame 212 of the present invention, however, may include any number of a plurality of modules 218, with each module 218 having one or more sets 280 of blowers 282. In typical embodiments, each blower 282 may be driven by a motor, such as a DC brushless motor that is independently controllable by a control system to adjust and maintain desired cooling fluid flow characteristics through frame 212 and the associated electronics chassis 232.

Blowers 282 each include a respective inlet 284 that is arranged to intake the cooling fluid along a respective intake direction 226, 228 that is transverse to flow direction 234. In the embodiment illustrated in FIG. 5b, cooling fluid exit 216 permits outlet flow from blowers 282 along an outlet direction 235 that is in alignment/parallel to flow direction 234. It is contemplated, however, that frame 212 may be provided with any suitable cooling fluid outlet arrangement and orientation, including for either or both of cooling fluid outlet directions transverse or parallel to flow direction 234.

It is contemplated that the blower sets 280 may be configured to provide desired cooling fluid flow in a manner similar to blowers 20, 182 described above. Blower sets 280, however, utilize, for example, single-inlet forward-curved centrifugal blowers placed in substantially face to face relationship to together motivate cooling fluid flow through electronics chassis 230. Respective blowers 282a, 282b may be spaced apart by a desired spacing dimension "$x_2$" that is less than about 0.75 (75%) of the diameter dimension "$y_2$" of the impellers of blowers 282a, 282b, and more preferably between 0.5-0.75 (50-75%) of diameter dimension "$y_2$". The respective inlets 284a, 284b of blowers 282a, 282b lead to impellers which are preferably axially aligned along a respective axis of rotation 252, 254.

Figure 5C:
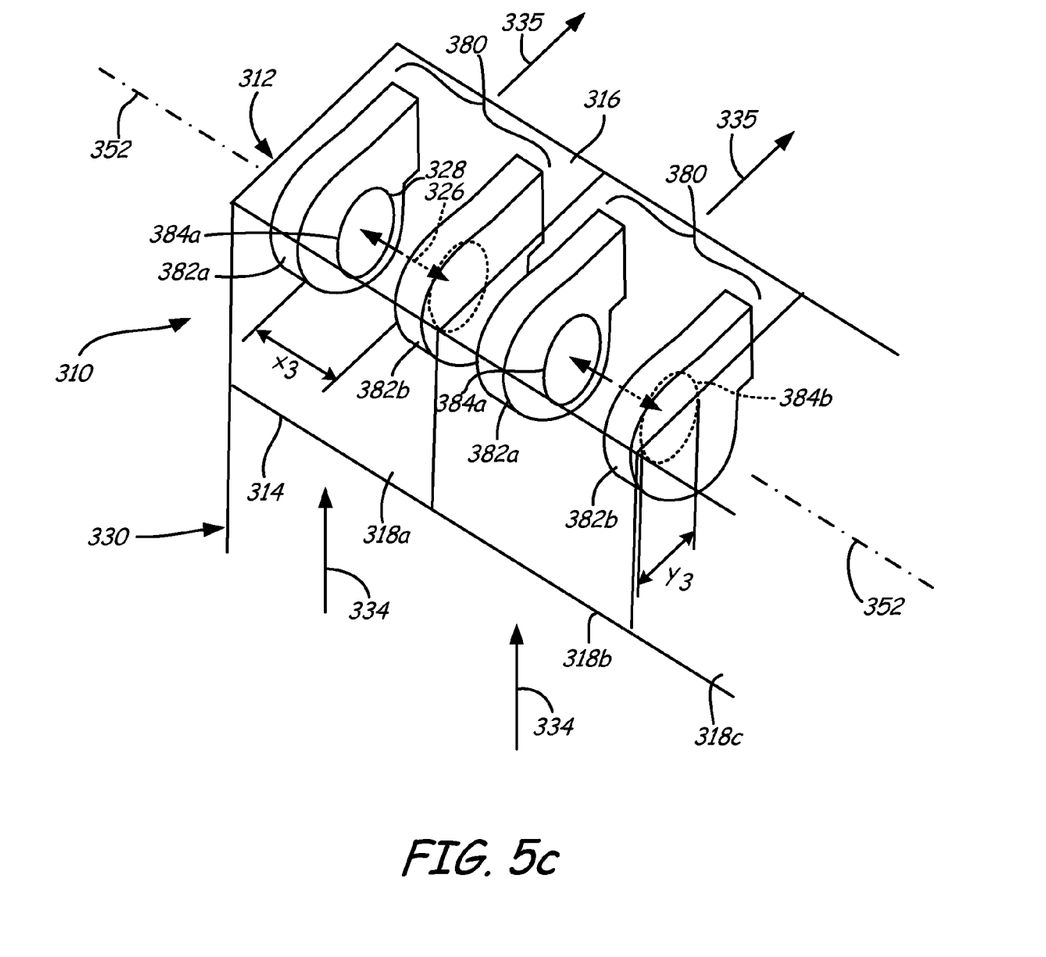
FIG. 5c is a schematic illustration of a cooling fan array of the present invention.

A still further embodiment is illustrated in FIG. 5c wherein cooling fan array 310 includes a frame 312 having a cooling fluid entrance 314 and a cooling fluid exit 316. Frame 312 includes a plurality of modules 318a-318c that are individually removable from and replaceable in frame 312 without operational interruption to others of modules 318a-318c. In this embodiment, each of the modules 318 in cooling fan array 310 includes one or more sets of centrifugal blowers 380. In the example arrangement of FIG. 5c, each set of centrifugal blowers 380 includes two centrifugal blowers 382a, 382b placed front to front in generally facing relationship with one another, such that inlet 384a of blower 382a is in facing relationship with inlet 384b of blower 382b. The respective impellers of blowers 382a, 382b may be configured to rotate in opposite circumaxial directions with respect to one another about an axis of rotation 352. Blower sets 380 may include two or more blowers 382a, 382b which may be arranged to coordinate with other blowers of the module 318 and/or array 310 to motivate cooling fluid flow through the interior chamber of electronics chassis 330. Blower sets 380 may operate to motivate the cooling fluid flow along flow direction 334, and to motivate the cooling fluid flow "in parallel."

In the illustrated embodiment, each module 318 includes one set 380 of forward-curved centrifugal blowers 382a, 382b. Frame 312 of the present invention, however, may include any number of a plurality of modules 318, with each module having one or more sets 380 of blowers 382. In some embodiments, respective sets 380 of blowers 382a, 382b among a plurality of modules 318 may be arranged so that their respective inlets 384a, 384b are all substantially mutually aligned along a respective axis of rotation 352. In typical embodiments, each blower 382 may be driven by a motor, such as a DC brushless motor that is independently controllable by a control system to adjust and maintain desired cooling flow characteristics through frame 312 and the associated electronics chassis 332.

Blowers 382 each include a respective inlet 384 that is arranged to intake the cooling fluid along a respective intake direction 326, 328 which is transverse to flow direction 334. In the embodiment illustrated in FIG. 5c, cooling fluid outlet 316 permits outlet flow from blowers 382 along an outlet direction 335 that is substantially transverse to flow direction 334.

It is contemplated that the blower sets 380 may be configured to provide desired cooling fluid flow in a manner similar to blowers 20, 182, 282 described hereinabove. Blower sets 380, however, utilize, for example, single inlet forward curved centrifugal blowers placed in substantially face to face relationship to together motivate cooling fluid flow through electronics chassis 330. In some embodiments, respective blowers 382a, 382b may preferably be spaced apart by a desired spacing dimension "$x_3$" that is less than about 0.75 (75%) of a diameter dimension "$y_3$" of the impellers of blowers 282a, 282b, and more preferably between 0.5-0.75 (50-75%) of diameter dimension "$y_3$". The respective inlets 384a, 384b of blowers 382a, 382b lead to impellers which are preferably axially aligned along a respective axis of rotation 352.

Table 1 represents actual performance measured on an example embodiment cooling fan array in accordance with the present invention, compared to axial fans in series, as described in "prior art" FIGS. 1 and 2.

TABLE 1

|  | Example Embodiment | Axial Fans in series (FIG. 1&2) | Delta from Example Embodiment |
|---|---|---|---|
| Air Flow | 295 cfm | 295 cfm | — |
| Static Pressure | 2.9 in. of $H_2O$ | 2.9 in. of $H_2O$ | — |
| Tip Speed | 5700 ft/min | 13,000 ft/min | +128% |
| Sound Power | Est. 75 dBA | Est. 90 dBA | +15 dBA |
| Physical Volume | $27 \times 10^5$ mm$^3$ | $21 \times 10^5$ mm$^3$ | −22% |

Table 2 represents actual performance of an example embodiment cooling fan array in accordance with the present invention, compared to conventional single width, single inlet centrifugal blowers.

TABLE 2

|  | Example Embodiment | Single width, single inlet FC Centrifugal | Delta from Example Embodiment |
|---|---|---|---|
| Air Flow | 295 cfm | 295 cfm | — |
| Static Pressure | 2.9 in. of $H_2O$ | 2.9 in. of $H_2O$ | — |
| Tip Speed | 5700 ft/min | 5,000 ft/min | −12% |
| Sound Power | Est. 75 dBA | Est. 73 dBA | −2 dBA |
| Physical Volume | $27 \times 10^5$ mm$^3$ | $42 \times 10^5$ mm$^3$ | +155% |

It is clear from the above data that the arrangements of the present invention are capable of producing similar air performance to conventional arrangements, while substantially reducing tip speed, which is a major indicator of acoustic levels. The present arrangements also have substantially reduced volume in comparison to conventional centrifugal blower arrangements, due primarily to the discovery of desired aerodynamic performance with significantly reduced spacing dimensions "x" between respective facing inlets of axially adjacent centrifugal blowers. The surprising aerodynamic performance permits the construction of a highly compact array of centrifugal blowers to achieve either greater performance than conventional arrangements of similar size, or reduced noise output in comparison of conventional blower arrangements of similar size.

The cooling fan arrays of the present invention, therefore, provide substantially enhanced efficiency and reduced acoustic signatures, without requiring substantially increased volume to the housing.

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different methods/devices and that various modifications can be accomplished without departing from the scope of the invention itself.

What is claimed is:

1. A cooling fan array for motivating cooling fluid through an interior chamber of an electronics chassis generally along a flow direction, said array comprising:
a frame having a cooling fluid entrance and a cooling fluid exit in fluid communication with the interior chamber, with at least one of said frame entrance and exit directing the cooling fluid flow along a direction parallel with said flow direction, and a plurality of modules individually removable from and replaceable in said frame without operational interruption to others of said modules, each of said modules comprising a centrifugal blower with an impeller driven by a motor and defining an axis of rotation, said blower having an inlet arranged to intake the cooling fluid along a respective intake direction transverse to said flow direction, wherein said blowers are arranged in said frame in one or more sets, with each set including at least two blowers oriented with respective inlets in facing relationship with one another and with respective axes of rotation being axially aligned with one another, said facing inlets being axially spaced apart by a spacing dimension that is less than 75% of a diameter dimension of said impeller within said set, such that said blowers operate in parallel to motivate the cooling fluid through said cooling fluid entrance.

2. A cooling fan array as in claim 1 wherein each of said blowers include a single scroll blower frame defining said dual opposed inlets and a blower outlet, and a forward-curved impeller.

3. A cooling fan array as in claim 2, including a separation plate defining an outlet plenum of said frame wherein said outlet plenum is fluidly connected to said cooling fluid inlet only through said blowers.

4. A cooling fan array as in claim 3 wherein said outlet plenum is fluidly connected to said cooling fluid exit.

5. A cooling fan array as in claim 4, including a divider plate in said outlet plenum defining separate outlet plenum zones for each module, with the outlet plenum zones being fluidly disconnected from each other in said outlet plenum.

6. A cooling fan array as in claim 2 wherein said cooling fluid exit directs cooling fluid substantially transverse to said flow direction.

7. A cooling fan array as in claim 1, said spacing dimension is 50-75% of a largest one of said diameter dimension of said impeller within said set.

8. A cooling fan array as in claim 1 wherein said motor is a DC brushless motor.

9. A cooling fan array as in claim 8 wherein said motor of each of said blowers is independently controllable.

10. An electronics chassis, comprising:
an interior chamber through which cooling fluid is motivated generally along a flow direction to cool electronic components;
a frame having an entrance through which the cooling fluid is drawn from said interior chamber, and an exit;
a plurality of modules in said frame individually removable from and replaceable in said frame without operational interruption to others of said modules, each of said modules including a centrifugal blower with an impeller driven by a motor and defining an axis of rotation, said blower having dual opposed inlets arranged to intake the cooling fluid along respective intake directions transverse to said flow direction, wherein said blowers are arranged in said frame in one or more sets, with each set including at least two blowers oriented with respective inlets in facing relationship with one another and with respective axes of rotation being axially aligned with one another, said facing inlets being axially spaced apart by a spacing dimension that is less than 75% of a diameter dimension of said impeller within said set, such that said blowers operate in parallel to motivate the cooling fluid through said frame entrance.

11. An electronics chassis, comprising:
an interior chamber through which cooling fluid is motivated generally along a flow direction to cool electronic components disposed in the interior chamber;
a frame having an entrance through which the cooling fluid is drawn from said interior chamber, and an exit;
a plurality of modules in said frame individually removable from and replaceable in said frame without operational interruption to others of said modules, each of said modules including one or more sets of two centrifugal blowers having forward-curved impellers driven in opposite circumaxial directions with respect to one another about respective impeller axes of rotation, said centrifugal blowers each having an inlet and an outlet, wherein the respective centrifugal blower inlets of said set are arranged in mutual facing relationship to intake the cooling fluid along respective substantially opposite intake directions that are both transverse to said flow direction, wherein said blowers of said set are arranged in said frame with respective axis of rotation being axially aligned with one another to operate in parallel to motivate the cooling fluid through said frame entrance.

12. An electronics chassis as in claim 11 wherein each of said centrifugal blowers are driven by a respective motor.

13. An electronics chassis as in claim 11 wherein said mutual facing inlets of said set of centrifugal blowers are axially spaced apart by a spacing dimension that is less than 75% of a diameter dimension of a largest diameter one of said forward-curved impellers of said set of centrifugal blowers.

* * * * *